(12) United States Patent
Zhang et al.

(10) Patent No.: US 12,336,135 B2
(45) Date of Patent: Jun. 17, 2025

(54) COMPUTATIONAL HEAT DISSIPATION STRUCTURE, COMPUTING DEVICE COMPRISING SAME, MINE

(71) Applicant: Canaan Creative Co., LTD., Beijing (CN)

(72) Inventors: Ning Zhang, Beijing (CN); Nangeng Zhang, Beijing (CN)

(73) Assignee: Canaan Creative Co., LTD., Beijing (CN)

( * ) Notice: Subject to any disclaimer, the term of this patent is extended or adjusted under 35 U.S.C. 154(b) by 0 days.

(21) Appl. No.: 18/544,346

(22) Filed: Dec. 18, 2023

(65) Prior Publication Data
US 2024/0121910 A1    Apr. 11, 2024

Related U.S. Application Data

(63) Continuation of application No. 18/301,380, filed on Apr. 17, 2023, now Pat. No. 11,882,669, which is a
(Continued)

(30) Foreign Application Priority Data

May 18, 2017    (CN) .......................... 201710353744.5

(51) Int. Cl.
*H05K 7/20* (2006.01)
*F04D 27/00* (2006.01)
*G06F 1/20* (2006.01)

(52) U.S. Cl.
CPC ....... *H05K 7/20154* (2013.01); *F04D 27/004* (2013.01); *G06F 1/206* (2013.01); *H05K 7/20145* (2013.01); *H05K 7/20518* (2013.01)

(58) Field of Classification Search
CPC . G06F 1/20; G06F 1/183; G06F 1/203; G06F 1/188; G06F 1/206; H05K 1/0203;
(Continued)

(56) References Cited

U.S. PATENT DOCUMENTS

| 4,908,696 A | * | 3/1990 | Ishihara | .............. H05K 1/0212 257/713 |
| 6,031,729 A | * | 2/2000 | Berkely | .............. H01L 23/5382 361/767 |

(Continued)

FOREIGN PATENT DOCUMENTS

| CN | 1663043 A | 8/2005 |
| CN | 1704865 A | 12/2005 |

(Continued)

OTHER PUBLICATIONS

Steinberg, "Cooling Techniques for Electronic Equipment—Chapter 6.7, 6.25, and 6.26," Second Edition, A Wiley-Interscience Publication, Oct. 1991, 21 pages.
(Continued)

*Primary Examiner* — Adam B Dravininkas
(74) *Attorney, Agent, or Firm* — Sheppard Mullin Richter & Hampton LLP

(57) ABSTRACT

A computational heat dissipation structure includes a circuit board including a plurality of heating components; and a radiator provided corresponding to the circuit board; wherein a space between the adjacent heating components is negatively correlated with heat dissipation efficiency of a region where the adjacent heating components are located. Since the space between the adjacent heating components of the disclosure is negatively correlated with the heat dissipation efficiency of the region where the adjacent heating components are located, i.e., the higher the heat dissipation efficiency of the region where the adjacent heating components are located is, the smaller the space between the adjacent heating components in the region will be, the heat dissipation efficiencies corresponding to the heating components are balanced, and load of a fan is reduced.

27 Claims, 10 Drawing Sheets

Related U.S. Application Data continuation of application No. 17/872,172, filed on Jul. 25, 2022, now Pat. No. 11,895,802, which is a continuation of application No. 16/614,054, filed as application No. PCT/CN2018/083956 on Apr. 20, 2018, now Pat. No. 11,425,839.

(58) Field of Classification Search
CPC .. H05K 7/2039; H05K 1/181; H05K 7/20154; H05K 7/20145; H05K 7/20518; H05K 7/20709; H05K 1/0201; H05K 7/20136
See application file for complete search history.

(56) References Cited

U.S. PATENT DOCUMENTS

| | | | |
|---|---|---|---|
| 6,212,074 | B1 | 4/2001 | Gonsalves et al. |
| 6,259,600 | B1 | 7/2001 | Talbot et al. |
| 6,437,979 | B1 | 8/2002 | Unrein |
| 6,477,051 | B1 | 11/2002 | Barsun |
| 6,580,611 | B1 | 6/2003 | Vandentop et al. |
| 7,027,299 | B2 * | 4/2006 | Wrycraft ............ H05K 7/20727 257/722 |
| 8,913,385 | B2 * | 12/2014 | Downing .............. H01L 23/467 361/679.48 |
| 10,820,405 | B1 | 10/2020 | Narasimhan |
| 2003/0218850 | A1 * | 11/2003 | Kubo ................... H01L 23/467 361/103 |
| 2005/0128710 | A1 | 6/2005 | Beitelmal et al. |
| 2006/0104025 | A1 | 5/2006 | Wabiszczewicz |
| 2006/0267192 | A1 | 11/2006 | Chen |
| 2007/0045801 | A1 | 3/2007 | Sugiyama et al. |
| 2007/0091578 | A1 | 4/2007 | Chang et al. |
| 2008/0023189 | A1 | 1/2008 | Kimura et al. |
| 2008/0043433 | A1 | 2/2008 | Joshi et al. |
| 2008/0151501 | A1 | 6/2008 | Takasou |
| 2008/0158818 | A1 | 7/2008 | Clidaras et al. |
| 2009/0255659 | A1 | 10/2009 | Xu et al. |
| 2011/0292596 | A1 | 12/2011 | El-Essawy et al. |
| 2012/0250323 | A1 | 10/2012 | Velu |
| 2013/0112373 | A1 | 5/2013 | Fukai et al. |
| 2013/0188315 | A1 | 7/2013 | Konishide et al. |
| 2014/0362576 | A1 | 12/2014 | Degner et al. |
| 2015/0245533 | A1 | 8/2015 | Wright et al. |
| 2016/0278236 | A1 | 9/2016 | Mitsui |

FOREIGN PATENT DOCUMENTS

| | | |
|---|---|---|
| CN | 2807480 Y | 8/2006 |
| CN | 101208003 A | 6/2008 |
| CN | 201426229 Y | 3/2010 |
| CN | 201541421 U | 8/2010 |
| CN | 102213855 A | 10/2011 |
| CN | 102404966 A | 4/2012 |
| CN | 102427707 A | 4/2012 |
| CN | 202979546 U | 6/2013 |
| CN | 203012616 U | 6/2013 |
| CN | 103369932 A | 10/2013 |
| CN | 203399465 U | 1/2014 |
| CN | 104066306 A | 9/2014 |
| CN | 104716113 A | 6/2015 |
| CN | 204668293 U | 9/2015 |
| CN | 204906958 U | 12/2015 |
| CN | 105571014 A | 5/2016 |
| CN | 105592669 A | 5/2016 |
| CN | 106102415 A | 11/2016 |
| CN | 205830253 U | 12/2016 |
| CN | 107239120 A | 10/2017 |
| JP | 5720443 B2 | 5/2015 |

OTHER PUBLICATIONS

Lan, "Heat Dissipation Efficiency of Corrugated Tank," DOI: 10.19487/j. cnki. 1001-8425.1990. 02. 009, 1990.

Yu et al., "Thermal Design and Analysis Techniques of Electronic Equipment (2nd Edition)," Beijing University of Aeronautics and Astronautics Press, Nov. 2008.

Zhang et al., "Analysis of effect thermal discharge CPU radiator," Cryo & Supercond vol. 36, No. 10, Sep. 8, 2008, English abstract provided.

Supplemental Search Report issued in Chinese application No. CN 201710353744 dated Apr. 28, 2020.

First Search for Chinese Application No. 201710353744.5 mailed on Apr. 24, 2019.

Supplemental Search for Chinese Application No. 201710353744.5 mailed on Aug. 29, 2021.

International Preliminary Report on Patentability Chapter II for PCT Application No. PCT/CN2018/083956 mailed on Sep. 12, 2019.

* cited by examiner

COMPUTATIONAL HEAT DISSIPATION STRUCTURE, COMPUTING DEVICE COMPRISING SAME, MINE

CROSS REFERENCE TO RELATED APPLICATION

This application is a continuation application of U.S. patent application Ser. No. 18/301,380, filed on Apr. 17, 2023, which is a continuation application of U.S. patent application Ser. No. 17/872,172, filed on Jul. 25, 2022. U.S. patent application Ser. No. 17/872,172 is a continuation application of U.S. patent application Ser. No. 16/614,054, filed on Nov. 15, 2019. The U.S. patent application Ser. No. 16/614,054 is a national phase application of International Application No. PCT/CN2018/083956, filed with the China National Intellectual Property Administration (CNIPA) on Apr. 20, 2018. International Application No. PCT/CN2018/083956 claims priority to and benefits of Chinese Patent Application No. 201710353744.5, filed with the CNIPA on May 18, 2017. The entire contents of all of the above-identified applications are incorporated herein by reference.

BACKGROUND OF THE INVENTION

1. Field of the Invention

The disclosure relates to heat dissipation, and specifically to a computing device and a computational heat dissipation structure thereof. The disclosure further relates to a mine formed of a plurality of the computing devices.

2. Related Art

In modern computing devices, component integration becomes higher, the number of components deployed on the devices is also increasing, and during operation of the device, the heat generated is also increasing. In a high temperature environment, poor heat dissipation of the components, or uneven heat dissipation of the components at different positions will cause working instability, reduced performance, and shorter working life of the entire circuit. Therefore, the modern computing device has a high requirement for heat dissipation.

Currently, the heat dissipation method is air cooling. Radiators made of a material with high thermal conductive efficiency are mounted on the high heating components, and then active heat dissipation is carried out through a fan. For example, the Chinese patent for utility model No. ZL201520353408.7 discloses a chip heat dissipation device, a virtual digital coin digger and a computing device, wherein the chip heat dissipation device comprises a chip welded onto a front of a printed circuit board, a first radiator connected to a top of the chip for dissipating heat, and a second radiator connected to a back of the printed circuit board and a part corresponding to a bottom of the chip for dissipating heat, and a fan is located on both sides of a case of the virtual digital coin digger to take away heat generated by the chip in working, and ensure normal working of the digger.

However, in the prior art, since the chip components are deployed on the circuit board in an equal space, and positions relative to the air duct are different, a temperature difference between an air inlet and an air outlet is relatively large, and a temperature equalization effect is poor. On such basis, air flowing speed is often increased by increasing rotation speed of the fan, thereby ensuring that the temperature in the hottest region satisfies use requirement, but such method also increases load of the fan.

SUMMARY OF THE INVENTION

The technical problem to be solved by the disclosure is to provide a computational heat dissipation structure, and a computing device comprising same, and a mine that can balance heat dissipation efficiencies corresponding to respective heating components, and reduce load of a fan.

To solve the above technical problem, the computational heat dissipation structure of the disclosure comprises a circuit board comprising a plurality of heating components; and a radiator provided corresponding to the circuit board; wherein a space between the adjacent heating components is negatively correlated with heat dissipation efficiency of a region where the adjacent heating components are located.

In one embodiment of the computational heat dissipation structure, the circuit board comprises a first side face and a second side face, wherein when the circuit board is in a working state, an output heat of the first side face is larger than that of the second side face.

In one embodiment of the computational heat dissipation structure, the radiator comprises a main heat sink carrying the circuit board; and an auxiliary heat sink pressing the circuit board against the main heat sink tightly.

In one embodiment of the computational heat dissipation structure, the auxiliary heat sink presses the circuit board against the main heat sink by way of resilient press.

In one embodiment of the computational heat dissipation structure, a thermal conductive material is filled in a gap between the auxiliary heat sink and the circuit board.

In one embodiment of the computational heat dissipation structure, the thermal conductive material is thermal conductive silicone grease or thermal conductive rubber pad.

In one embodiment of the computational heat dissipation structure, heat dissipation efficiency of the main heat sink is higher than that of the auxiliary heat sink, the main heat sink is provided corresponding to the first side face, and the auxiliary heat sink is provided corresponding to the second side face.

In one embodiment of the computational heat dissipation structure, the main heat sink comprises a first heat dissipation body comprising a first surface and a second surface; and a first heat dissipation fin, wherein the first surface is connected to the first heat dissipation fin, and wherein the second surface is connected to the first side face. The auxiliary heat sink comprises a second heat dissipation body comprising a third surface and a fourth surface; and a second heat dissipation fin, wherein the third surface is connected to the second heat dissipation fin, and wherein the fourth surface is connected to the second side face.

In one embodiment of the computational heat dissipation structure, there is a plurality of the auxiliary heat sink, each corresponding to one or more of the heating components.

The computing device of the disclosure comprises a device housing enclosing an enclosed heat-dissipation air duct, and further comprising the above computational heat dissipation structure, wherein the computational heat dissipation structure is located in the heat-dissipation air duct.

In one embodiment of the computing device, a temperature detecting unit for measuring a temperature in the heat-dissipation air duct is mounted within the heat-dissipation air duct.

In one embodiment of the computing device, it further comprises a controller comprising a fan control module; and a fan, the temperature detecting unit and the fan respectively electrically connected to the fan control module; wherein the fan control module adjusts dynamically a rotation speed of the fan based on a real-time temperature in the heat-dissipation air duct detected by the temperature detecting unit.

In one embodiment of the computing device, the heat-dissipation air duct comprises an air inlet mounted with a first panel assembly; and an air outlet mounted with a second panel assembly; wherein the first panel assembly and the second panel assembly fix the radiator within the heat-dissipation air duct.

In one embodiment of the computing device, the fan comprises a first fan provided at the air inlet and connected to the first panel assembly.

In one embodiment of the computing device, the fan comprises a second fan provided at the air outlet and connected to the second panel assembly.

In one embodiment of the computing device, the heat-dissipation air duct comprises a plurality of temperature zones, and wherein there is a plurality of the temperature detecting unit, each being provided in respective temperature zones.

In one embodiment of the computing device, the controller further comprises a chip control module electrically connected to respective temperature detecting units, wherein the chip control module adjusts dynamically working frequencies of the heating components in respective temperature zones based on real-time temperature of the temperature zone detected by respective temperature detecting unit.

In one embodiment of the computing device, there is at least one the computational heat dissipation structure.

The mine of the disclosure comprises at least one setting frame provided with at least one computing device, wherein the computing device is the above computing device.

As compared to the prior art, the disclosure has the following advantages: since the space between the adjacent heating components is negatively correlated with the heat dissipation efficiency of the region where the adjacent heating components are located, i.e., the higher the heat dissipation efficiency of the region where the adjacent heating components are located is, the smaller the space between the adjacent heating components in the region will be, the computational heat dissipation structure and the computing device provided by the disclosure balance the heat dissipation efficiencies corresponding to respective heating components, and reduce load of the fan. Therefore, the mine provided by the disclosure avoids the problem of overheating damage of the heating components even if a large number of computing devices are gathered in the same space.

Further, the disclosure dynamically controls efficiency of the fan and working frequencies of the heating components within different temperature zones, further balance the heat dissipation efficiencies of different regions in the heat-dissipation air duct, and improve service life of the heating components, entire circuit and fan through temperature data fed back by the temperature detecting units.

Hereinafter the disclosure is explicitly described with reference to the drawings and the detailed embodiments, but the disclosure is not limited thereto.

PREFERABLE EMBODIMENTS OF THE INVENTION

Hereinafter the technical solution of the disclosure is explicitly described with reference to the drawings and the detailed embodiments to further understand object, solution and effect of the disclosure, instead of limiting the scope protected by the appended claims of the disclosure.

The disclosure discloses one or more embodiments containing characteristics of the disclosure. The disclosed embodiments are only for exemplary explanation. The scope protected by the disclosure is not limited to the disclosed embodiments. The disclosure is defined by the appended claims.

References of "one embodiment", "an embodiment" and "exemplary embodiment" in the specification refer to that the described embodiment can comprise specific features, structures or characteristics, but not every embodiment must comprise these specific features, structures or characteristics. In addition, such expression does not refer to the same embodiment. Further, when the specific feature, structure or characteristic is described with reference to the embodiments, no matter whether it is clearly described, it has shown that combination of such specific feature, structure or characteristic with other embodiments is within the knowledge range of those skilled in the art.

The specification and subsequent claims use some phrases to refer to specific components or members, those ordinary in the art shall understand that technology users or manufacturers can use different nouns or terms to call the same component or member. The specification and subsequent claims do not distinguish the components or members by different names, but distinguishing based on functional differences of the components or members as a criterion. "Comprising" and "including" mentioned in the whole specification and subsequent claims are open phrases, and shall be understood as "include but not limited to". In addition, the word "connection" here includes any direct or indirectly electrical connection means. Indirect electrical connection means comprises connection through other device.

It shall be noted that terms of "transverse", "vertical", "up", "down", "front", "back", "left", "right", "upright", "horizontal", "top", "bottom", "in", and "out" indicating orientation or position relations in the disclosure are orientation or position relations based on the drawings in order to facilitate describing the disclosure and simplifying description only, rather than indicating or suggesting that the referred device or element must have a specific orientation, and structured and operated in a specific orientation, so they cannot be understood as limitations to the disclosure.

Figure 1:
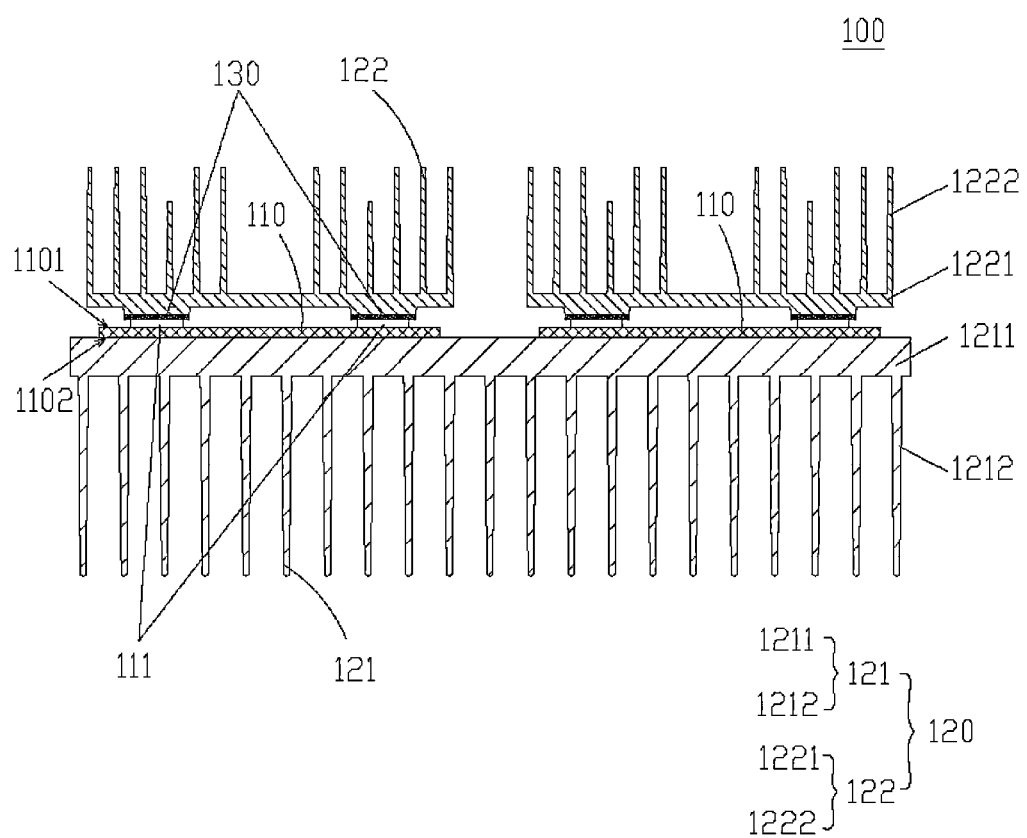
FIG. 1 is a structure diagram of a computational heat dissipation structure according to one embodiment of the disclosure.
Figure 5:
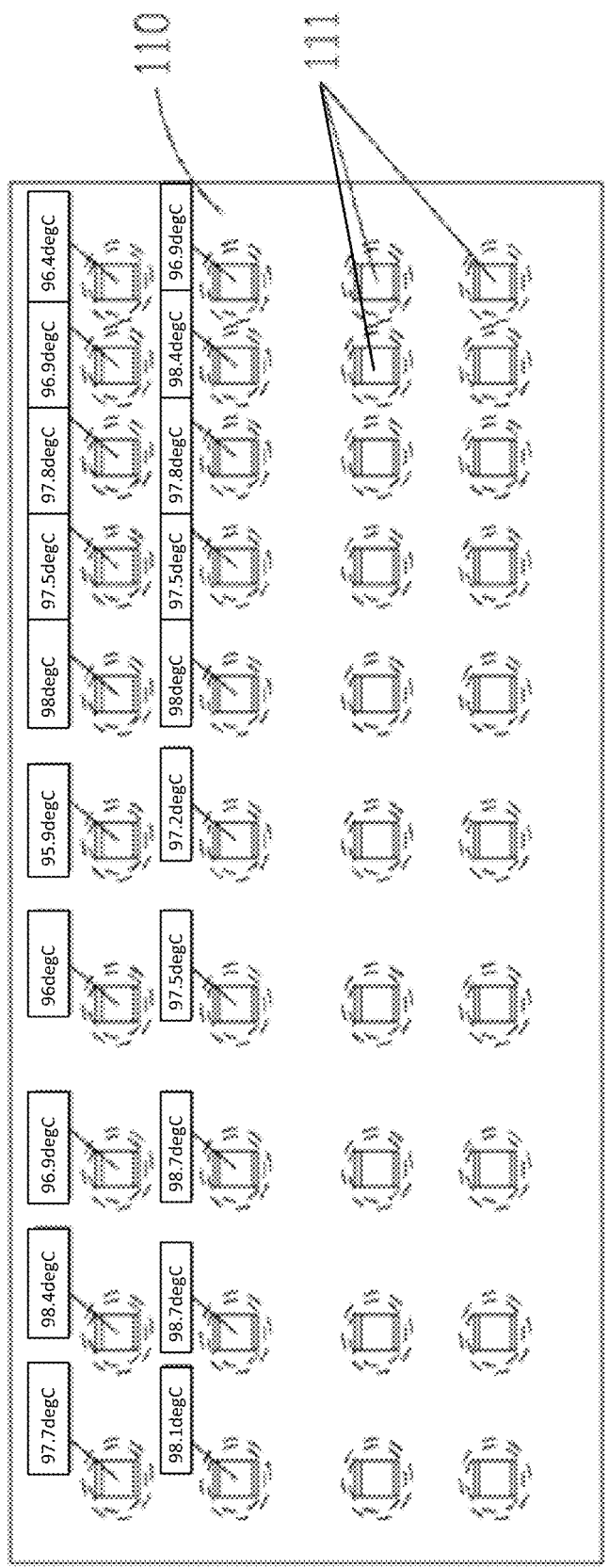
FIG. 5 is a deployment diagram of heating components on a circuit board in the disclosure.

FIG. 1 is a structure diagram of a computational heat dissipation structure according to one embodiment of the disclosure. As shown in FIG. 1 and FIG. 5, the computational heat dissipation structure 100 comprises a circuit board 110 comprising a plurality of heating components 111, and a radiator 120, wherein a space between the adjacent heating components 111 is negatively correlated with heat dissipation efficiency of a region where the adjacent heating components 111 are located.

Figure 2:
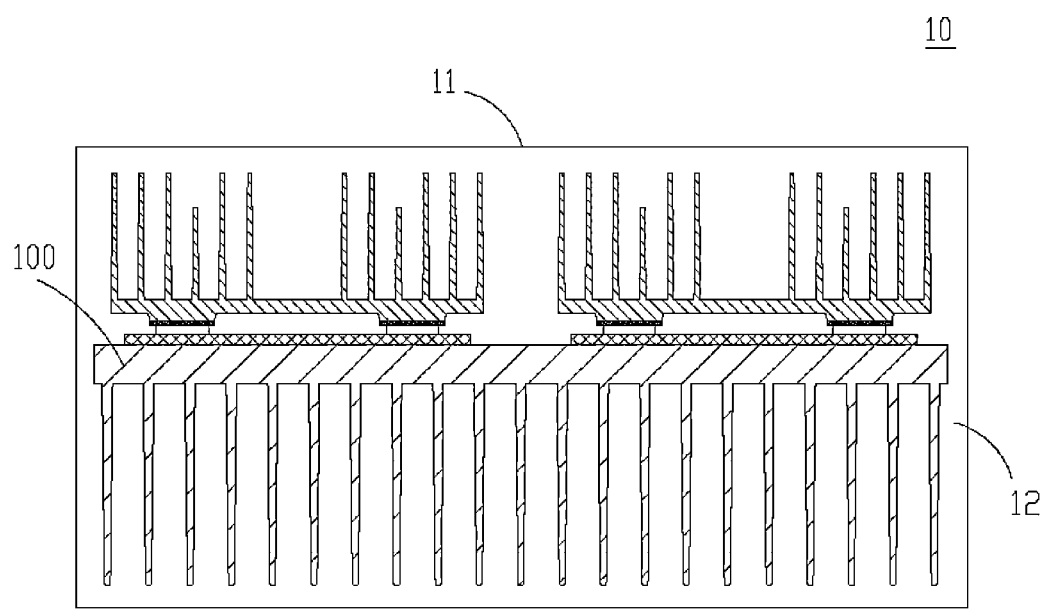
FIG. 2 is a structure diagram of a computing device according to one embodiment of the disclosure.

FIG. 2 is a structure diagram of a computing device according to one embodiment of the disclosure, wherein the computing device comprises the computational heat dissipation structure illustrated in FIG. 1.

As shown in FIG. 2, the computing device 10 comprises a device housing 11 enclosing an enclosed heat-dissipation air duct 12, and the computational heat dissipation structure 100, wherein the computational heat dissipation structure 100 is located in the heat-dissipation air duct 12.

Figure 3:
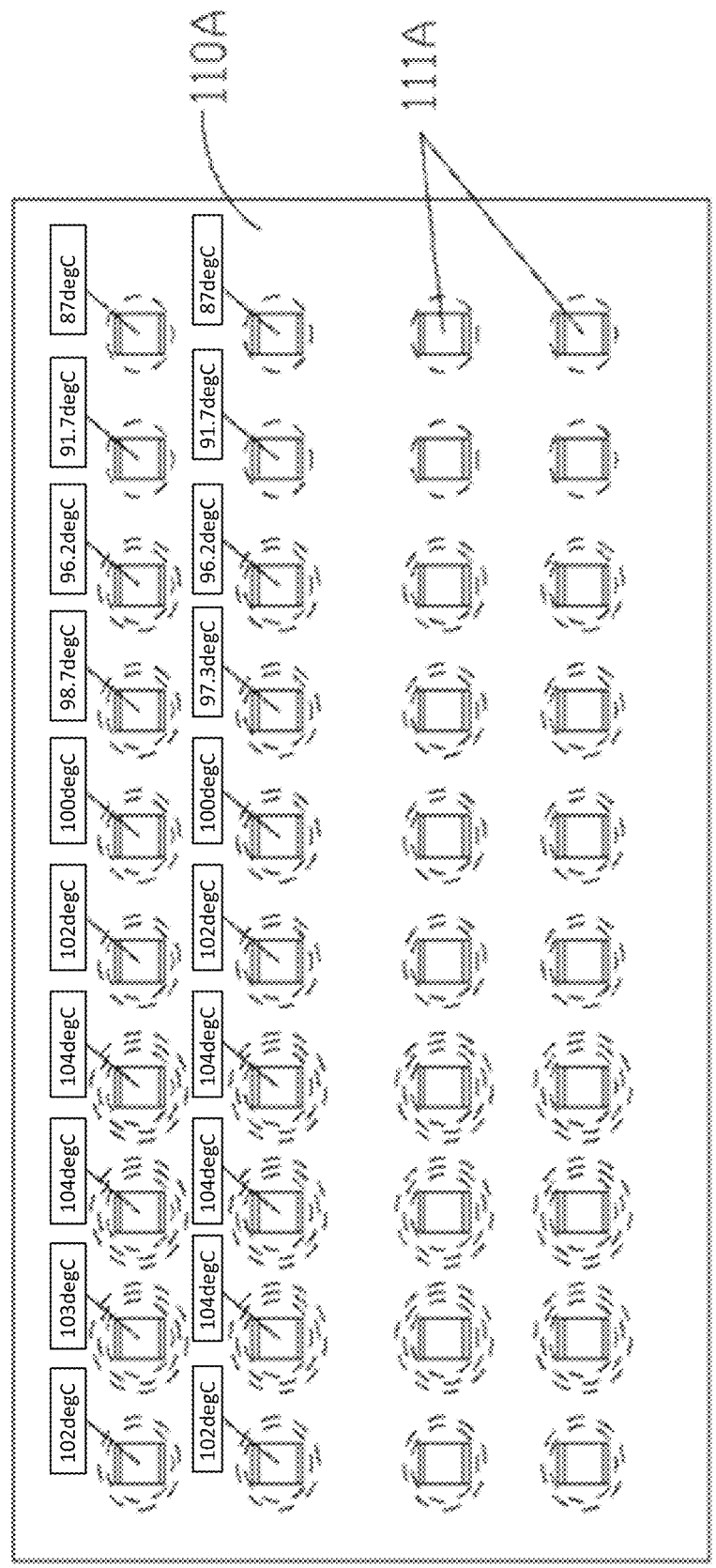
FIG. 3 is a deployment diagram of heating components on a circuit board in the prior art.
Figure 4:
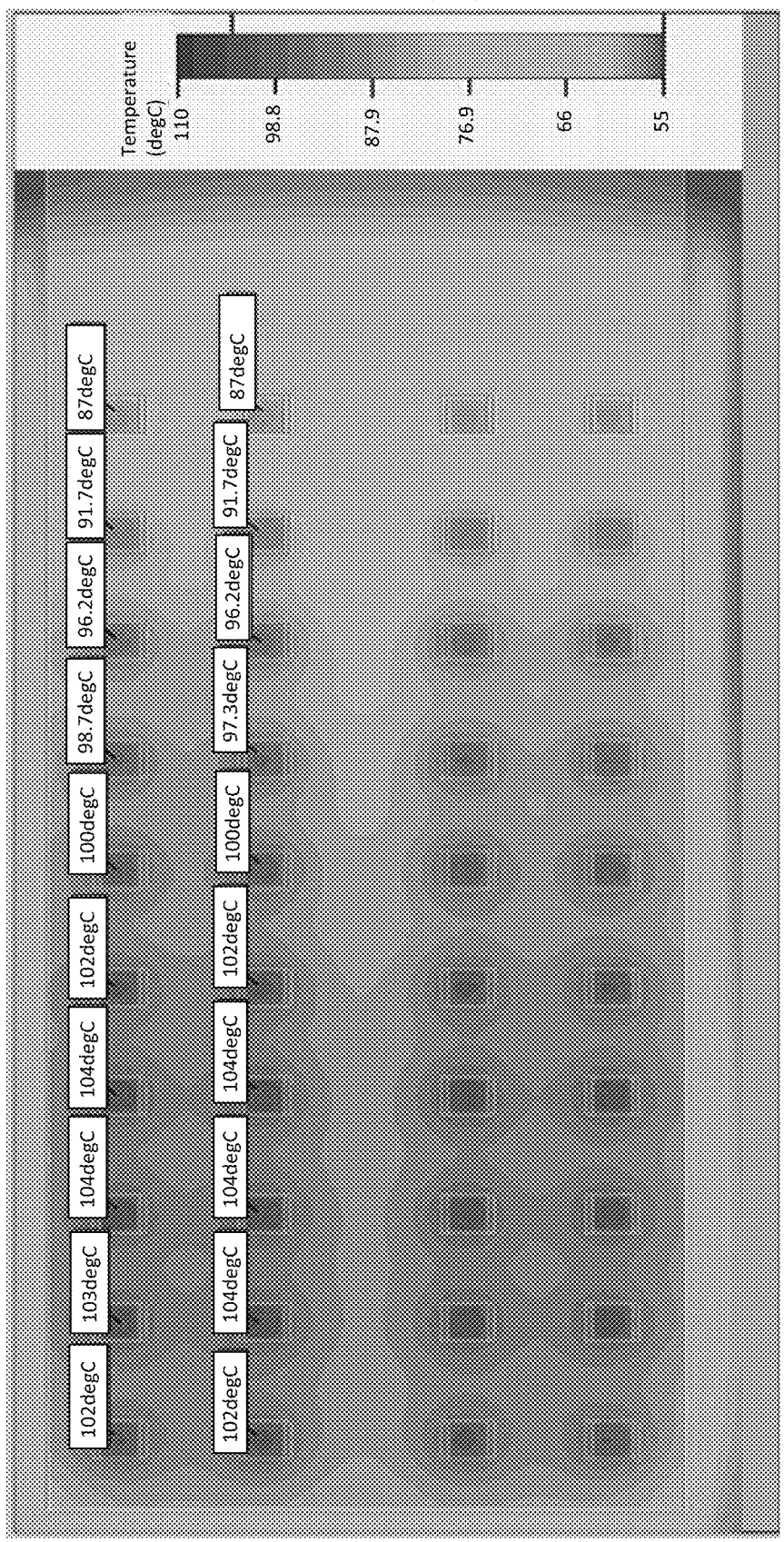
FIG. 4 is a working effect diagram of the heating components on the circuit board of FIG. 3.

FIGS. 3 and 4 are deployment diagrams of heating components on a circuit board in the prior art. As shown in the figures, a left side of the circuit board 110A is close to an air outlet, and a right side is close to an air inlet. As shown in FIG. 3, a plurality of heating components 111A deployed on the device are equally spaced, while a temperature difference between the air outlet and the air inlet is relatively large. Referring to FIGS. 3 and 4, the temperature of the heating component at the air inlet is 87 deg. C., while at a position closer to the air outlet the maximum temperature has reached 104 deg. C. As can be seen, heat dissipation of the heating components 111A is uneven. When temperatures of some heating components 111A are too high due to low heat dissipation efficiency, it might cause working instability, shorter working life and reduced performance of the entire circuit.

Figure 6:
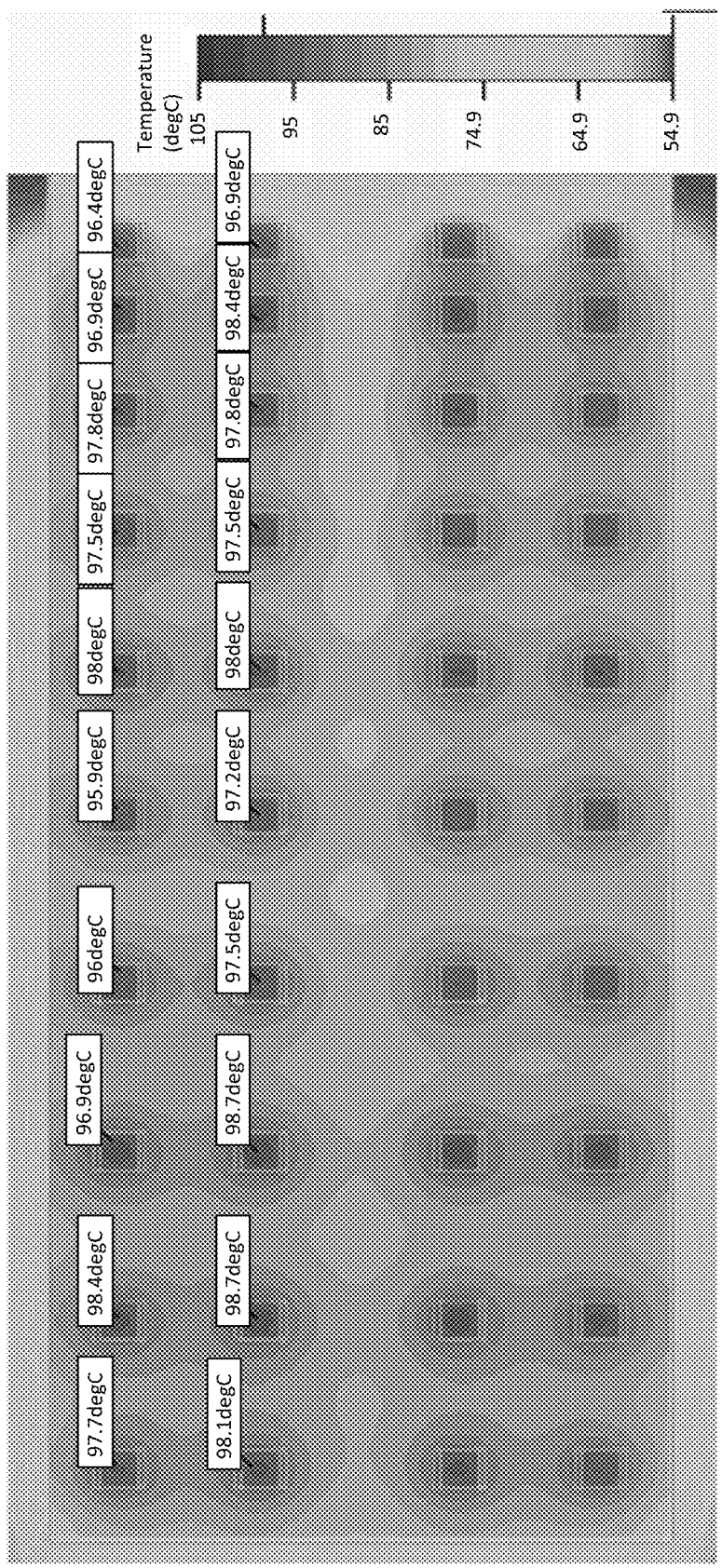
FIG. 6 is a working effect diagram of the heating components on the circuit board of FIG. 5.

FIGS. 5 and 6 are deployment diagrams of heating components on a circuit board of the computing device in the disclosure. As shown in FIGS. 5 and 6, a left side of the circuit board 110 provided in the disclosure is close to an air outlet, and a right side is close to an air inlet. As shown in the figures, the circuit board 110 is deployed with a plurality of heating components 111, while these heating components 111 are not equally spaced, and a space between the adjacent heating components is negatively correlated with heat dissipation efficiency of a region where the adjacent heating components are located. Therefore, if the space between the adjacent heating components at the air inlet is small, the space between the adjacent heating components at the air outlet is large, so that temperatures of respective heating components on the circuit board can be balanced.

As can be seen from the figures, the computational heat dissipation structure deployed with the unequally spaced heating components provided in the disclosure has a maximum temperature of 98.7 deg. C., and a minimum temperature of 95.9 deg. C. with the same rotation speed of the fan as the structure deployed with the equally spaced heating components as shown in FIGS. 3 and 4. As can be seen, with the same rotation speed of the fan, the structure deployed with the unequally spaced heating components provided by the disclosure enables temperatures of the heat dissipation components in respective regions to keep substantially balanced.

The deployed space of the heating components in respective regions of the circuit board in this embodiment can be obtained through a large number of simulation experiments.

The advantageous effect of the disclosure lies in: since the space between the adjacent heating components is negatively correlated with the heat dissipation efficiency of the region where the adjacent heating components are located, i.e., the higher the heat dissipation efficiency of the region where the adjacent heating components are located is, the smaller the space between the adjacent heating components in the region will be, the heat dissipation efficiencies corresponding to the heating components are balanced, and load of the fan is reduced.

In one embodiment, as shown in FIG. 1, the circuit board 110 of the computational heat dissipation structure 100 comprises a first side face 1101 and a second side face 1102.

In one embodiment, as shown in FIG. 1, the radiator 120 comprises a main heat sink 121 and an auxiliary heat sink 122, wherein the heat dissipation efficiency of the main heat sink 121 is higher than that of the auxiliary heat sink 122.

In this embodiment, the main heat sink 121 carries the circuit board 110, which can function to dissipate heat, and also function to support the air duct structure, so it functions to dissipate heat and support simultaneously.

The auxiliary heat sink 122 presses the circuit board 110 against the main heat sink 121, which can function to dissipate heat, and also function to fix the circuit board 110.

The advantageous effect of this embodiment lies in: since the main heat sink functions to dissipate heat and can also carry the circuit board, it is unnecessary to additionally set other structure for carrying the circuit board, and it saves cost.

To avoid damage to the heating components 111, in this embodiment, the auxiliary heat sink 122 presses the circuit board 110 against the main heat sink 121 by the way of resilient press. Through such way of press, it can function to fix, and meanwhile, the heating components 111 are not easy to damage since the heating components 111 suffer from a small pressure.

In one embodiment, as shown in FIG. 1, a thermal conductive material 130 is filled in a gap between the auxiliary heat sink 122 and the circuit board 110, and the thermal conductive material 130 is, for example, thermal conductive silicone grease or thermal conductive rubber pad.

In this embodiment, since the auxiliary heat sink 122 presses the circuit board 110 against the main heat sink 121 by the way of resilient press, a gap exists unavoidably between the auxiliary heat sink 122 and the circuit board 110 to affect heat dissipation effect. Considering of such case, thermal conductive silicone grease or thermal conductive rubber pad is filled in the gap between the auxiliary heat sink 122 and the circuit board 110. A heat dissipation area of the circuit board 110 is increased in a disguised form by filling thermal conductive silicone grease or thermal conductive rubber pad in the gap between the auxiliary heat sink 122 and the circuit board 110, thereby further enhancing the heat dissipation effect of the circuit board 110.

The advantageous effect of this embodiment lies in that the heat dissipation effect of the circuit board is further enhanced by filling the thermal conductive material in the gap between the auxiliary heat sink and the circuit board.

In one embodiment, as shown in FIG. 1, since the heat dissipation efficiency of the main heat sink 121 is higher than that of the auxiliary heat sink 122, the main heat sink 121 can be provided corresponding to the second side face 1102 of the circuit board 110, and the auxiliary heat sink 122 can be provided corresponding to the first side face 1101 of the circuit board 110.

Specifically, the main heat sink 121 comprises a first heat dissipation body 1211 comprising a first surface and a second surface opposite to each other, and a first heat dissipation fin 1212 connected to the first surface of the first heat dissipation body 1211, and the second surface of the first heat dissipation body 1211 connected to the second side face 1102 of the circuit board 110. The auxiliary heat sink 122 comprises a second heat dissipation body 1221 comprising a third surface and a fourth surface opposite to each other, and a second heat dissipation fin 1222 connected to the third surface of the second heat dissipation body 1221, and the fourth surface of the second heat dissipation body 1221 connected to the first side face 1101 of the circuit board 110.

Because of the main heat sink and the auxiliary heat sink, heat on two sides of the circuit board is balanced, thereby further balancing heat of respective regions in the heat-dissipation air duct.

Figure 7:
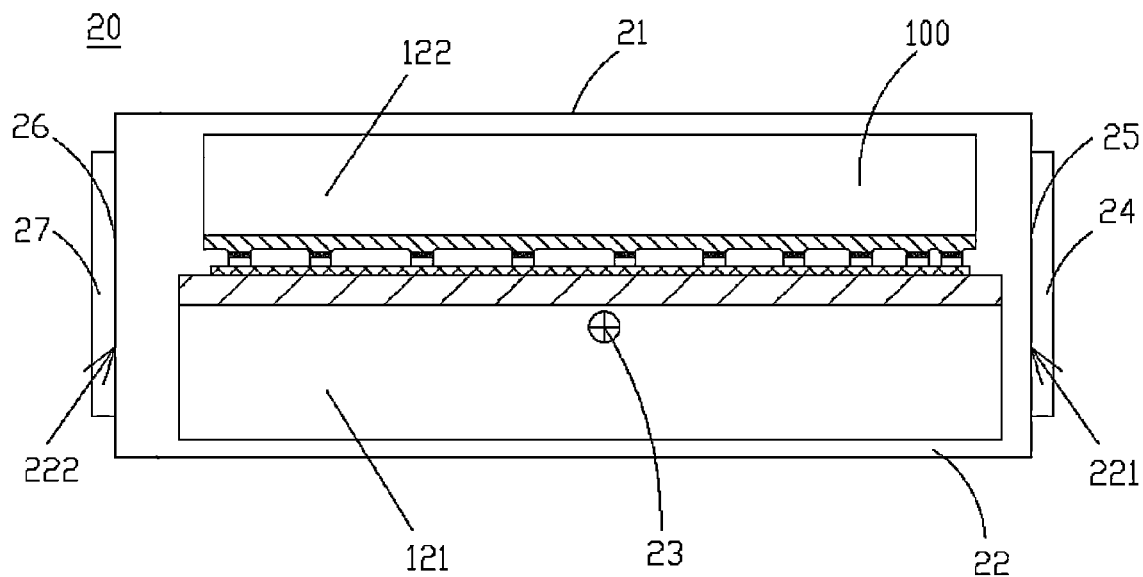
FIG. 7 is a structure diagram of a computing device according to one embodiment of the disclosure.

In one embodiment, as shown in FIG. 7, a computing device 20 comprises a device housing 21 enclosing an enclosed heat-dissipation air duct 22, and the computational heat dissipation structure 100, wherein the computational heat dissipation structure 100 is located in the heat-dissipation air duct 22. The heat-dissipation air duct 22 is mounted with a temperature detecting unit 23 for measuring a temperature in the heat-dissipation air duct 22.

Figure 8:
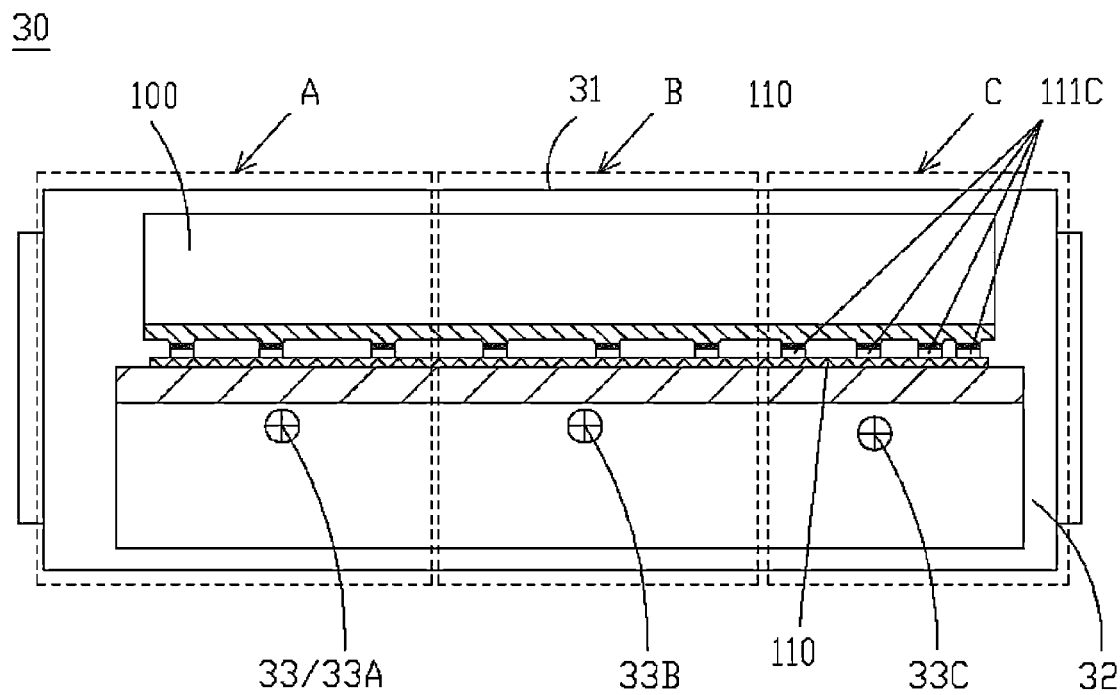
FIG. 8 is a structure diagram of a computing device according to one embodiment of the disclosure.

In one embodiment, as shown in FIG. 8, a computing device 30 comprises a device housing 31 enclosing an enclosed heat-dissipation air duct 32, and the computational heat dissipation structure 100, wherein the computational heat dissipation structure 100 is located in the heat-dissipation air duct 32. The heat-dissipation air duct 32 is mounted with a plurality of temperature detecting units 33 for measuring temperatures in the heat-dissipation air duct 32, and the plurality of temperature detecting units 33 are provided in different regions of the heat-dissipation air duct 32 to real-time detect temperatures of different regions.

In this embodiment, the temperature detecting units are mounted in the heat-dissipation air duct to record temperatures in the heat-dissipation air duct, so that during working of the computing device, the user can acquire the temperatures in the heat-dissipation air duct, and adjusts a rotation speed of the fan.

In one embodiment, as shown in FIG. 7, the computing device 20 further comprises a controller comprising a fan control module and comprises a fan 24, the temperature detecting unit 23 and the fan 24 respectively electrically connected to the fan control module. The fan control module dynamically adjusts a rotation speed of the fan 24 based on the temperature in the heat-dissipation air duct 22 detected by the temperature detecting unit 23, so that the fan 24 is avoided to keep a high rotation speed for a long time, thereby reducing electric energy loss.

In this embodiment, the rotation speed of the fan is automatically adjusted by the fan control module, or manually adjusted by giving an instruction based on the temperature fed back from the temperature detecting unit.

In one embodiment, as shown in FIG. 7, the heat-dissipation air duct 22 comprises an air inlet 221 mounted with a first panel assembly 25, and an air outlet 222 mounted with a second panel assembly 26. The first panel assembly 25 and the second panel assembly 26 fix the radiator 120, i.e., the main heat sink 121 and the auxiliary heat sink 122, within the heat-dissipation air duct 22 in parallel.

The fan 24 is, for example, fixed onto the first panel assembly 25 at the air inlet 221.

In one embodiment, as shown in FIG. 7, the computing device 20 further comprises a fan 27 provided at the air outlet 222, and connected to the second panel assembly 26.

In this embodiment, the computing device 20 is provided with the fan 24 and the fan 27 on both ends. The fan 24 at the air inlet 221 blows air, and the fan 27 at the air outlet absorbs air, so that a faster and more fluent heat dissipation airflow is formed in the heat-dissipation air duct 22, and the heat dissipation effect is further enhanced.

According to the respective embodiments, it shall be noted that the position and the number of fan in the disclosure can be adjusted according to the need. For example, the fan 27 can be provided only at the air outlet 222 to suction out air, the fan 24 can be provided only at the air inlet 221 to blow air, and the fans also can be provided at both the air outlet 222 and the air inlet 221 to enhance airflow, but the disclosure is not limited thereto.

In one embodiment, as shown in FIG. 8, the heat-dissipation air duct 32 is divided into, for example, three temperature zones, which are a first temperature zone A, a second temperature zone B, and a third temperature zone C, respectively. The temperature detecting units are, for example, three, which are the temperature detecting units 33A, 33B and 33C, respectively, and the temperature detecting units 33A, 33B and 33C respectively detect temperatures of the first temperature zone A, the second temperature zone B, and the third temperature zone C of the heat-dissipation air duct 32. Of course, each temperature zone can also correspond to more than one temperature detecting unit.

The first temperature zone A, the second temperature zone B, and the third temperature zone C correspond to a part of the heating components on the circuit board 110, respectively.

The controller of the computing device 30 further comprises a chip control module electrically connected to the temperature detecting units 33A, 33B and 33C, wherein the chip control module adjusts dynamically working frequencies of the heating components in the temperature zones where the temperature detecting units 33A, 33B and 33C are located based on the temperatures of different temperature zones A, B and C in the heat-dissipation air duct 32 detected by the temperature detecting units 33A, 33B and 33C.

For example, when the temperature of the third temperature zone C detected by the temperature detecting unit 33C is too high, the chip control module controls a part of the heating components 111C corresponding to the third temperature zone C to reduce the working frequencies, so as to decrease the heat of this part of the heating components 111C, and balance the heat dissipation efficiencies of respective heating components.

In this embodiment, life of the heating components can be prolonged, and problems of too much noise due to long-time overload working of the fan, and overall working efficiency affected by damage of the fan and the circuit can be avoided by reducing the working efficiencies of a part of the heating components in an overheating region.

Figure 9:
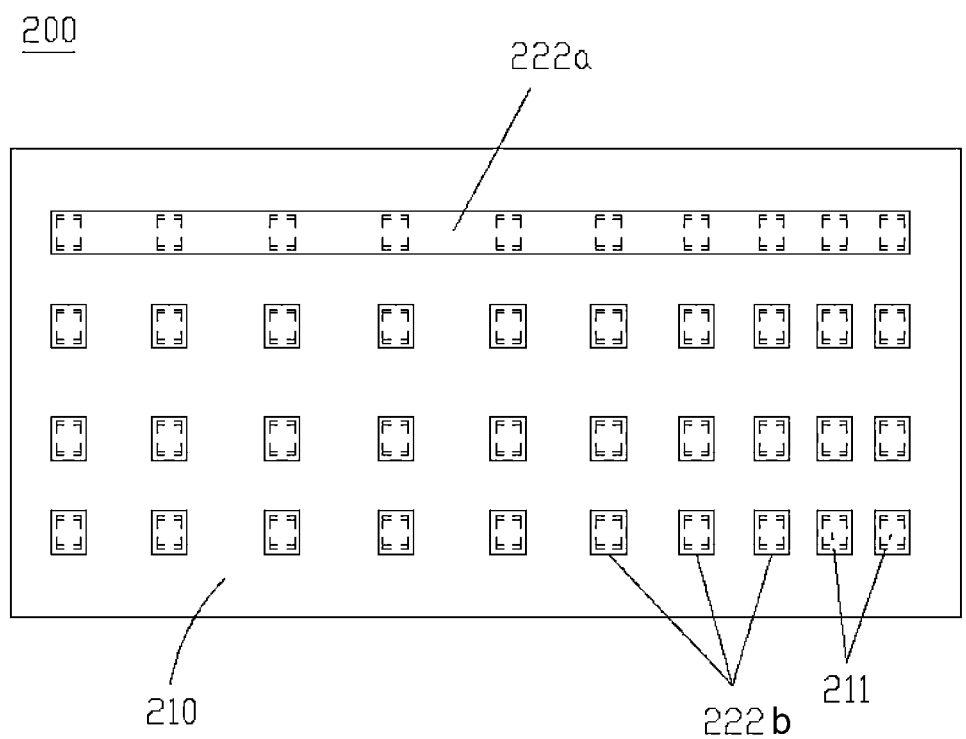
FIG. 9 is a structure diagram of a computational heat dissipation structure according to one embodiment of the disclosure.

FIG. 9 is a structure diagram of a computational heat dissipation structure according to one embodiment of the disclosure. In one embodiment, as shown in FIG. 9, the computational heat dissipation structure 200 comprises a circuit board 210 and a radiator. The circuit board 210 is provided with a plurality of heating components 211, which are unequally spaced, and a space between the adjacent heating components 211 is negatively correlated with heat dissipation efficiency of a region where the adjacent heating components 211 are located.

The radiator comprises a main heat sink (not shown) and an auxiliary heat sink provided on two side faces of the circuit board 210 respectively. For example, there may be a plurality of auxiliary heat sinks 222b, each being provided corresponding to one of the heating components 211. Of course, each auxiliary heat sink 222a may also be provided corresponding to more of the heating components 211. It shall be noted that in different embodiments, the number of circuit board 210 may be one or more, but the disclosure is not limited thereto.

Figure 10:
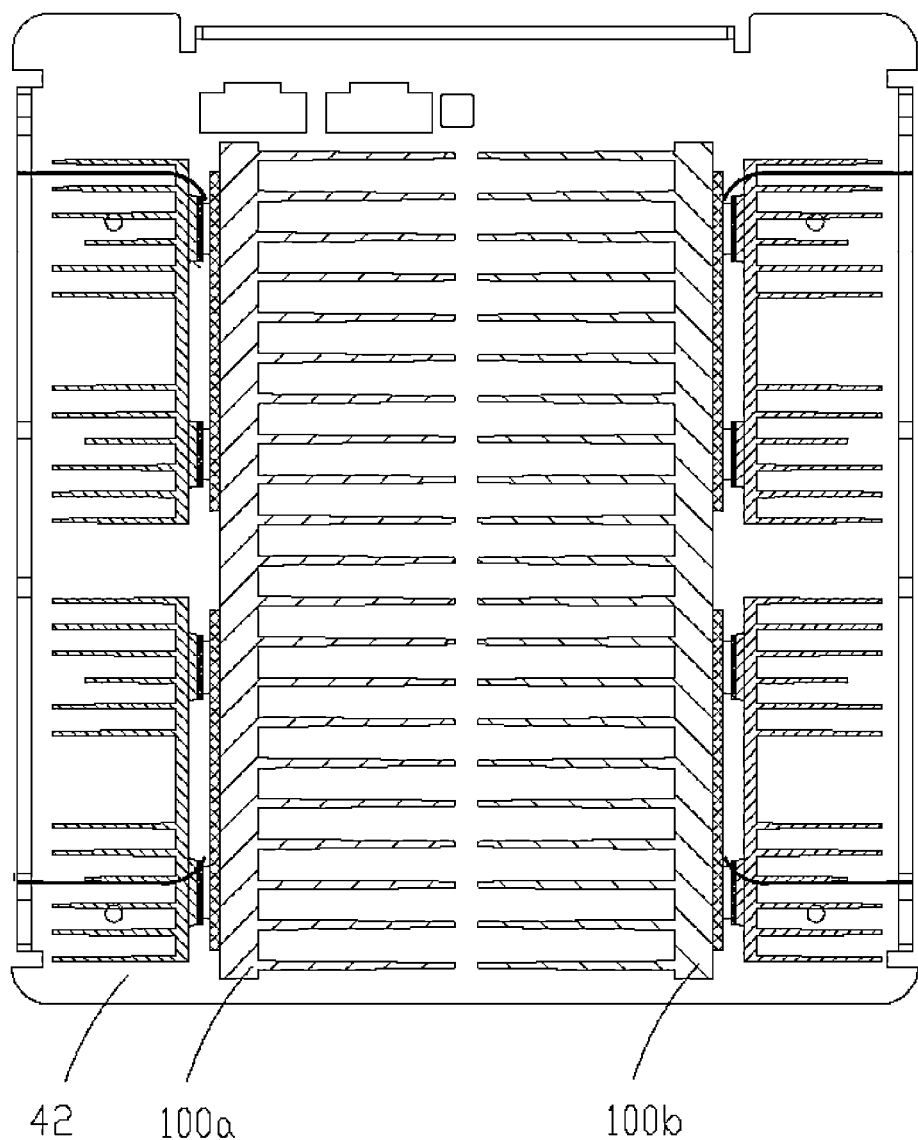
FIG. 10 is a structure diagram of a computing device according to one embodiment of the disclosure.

According to the disclosure, there may be only one computational heat dissipation structure in the heat-dissipation air duct as the computing device shown in FIGS. 1, 7 and 8, and alternatively there may be two computational heat dissipation structures 100a and 110b in a heat-dissipation air duct 42 as a computing device 40 shown in FIG. 10, wherein the computational heat dissipation structures 100a and 110b are symmetrically provided. Of course, more computational heat dissipation structures can also be included.

The computing device of the disclosure can be a computing device for a virtual coin mining machine, and a mine in the disclosure refers to a place where a large number of mining machines are gathered for virtual coin mining.

Figure 11:
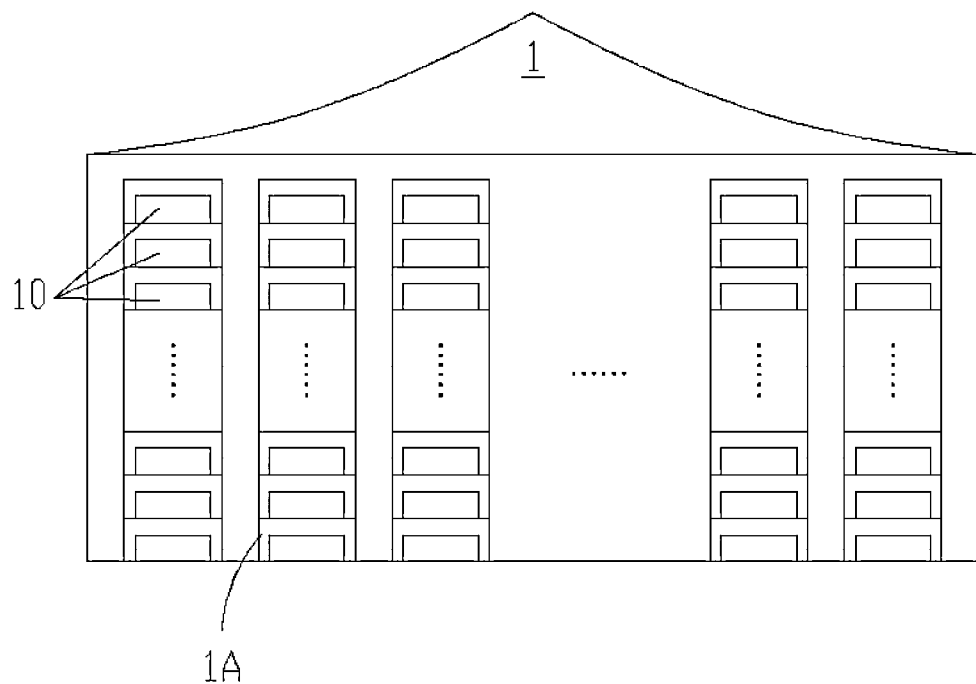
FIG. 11 is a structure diagram of a mine according to one embodiment of the disclosure.

The structure of the mine in one embodiment of the disclosure is shown in FIG. 11. The mine 1 comprises at least one setting frame 1A provided with at least one computing device of the disclosure, for example, the computing device 10. It shall be noted that the setting frame 1A can have computing devices in various ways, for example, parallel and stack, and the structure and the form of the setting frame 1A are not limited to the figures.

Of course, the disclosure also can have other various embodiments, and those skilled in the art can make various corresponding modifications and variations based on the disclosure without departing from spirit and essence of the disclosure, but these corresponding modifications and variations shall belong to the scope protected by the appended claims of the disclosure.

INDUSTRIAL APPLICABILITY

Since the space between the adjacent heating components is negatively correlated with the heat dissipation efficiency of the region where the adjacent heating components are located, i.e., the higher the heat dissipation efficiency of the region where the adjacent heating components are located is, the smaller the space between the adjacent heating components in the region will be, the computational heat dissipation structure and the computing device provided by the disclosure balance the heat dissipation efficiencies of respective heating components, and reduce load of the fan. Therefore, the mine provided by the disclosure avoids the problem of overheating damage of the heating components even if a large number of computing devices are gathered in the same space.

What is claimed is:
1. A circuit board, comprising:
a plurality of heat-generating components arranged in rows and columns, wherein the circuit board is placed in a cooling duct with an air inlet and an air outlet, a direction from the air inlet to the air outlet is a cooling direction, and along the cooling direction, adjacent heat-generating components in a same row include form at least five different interval lengths.
2. The circuit board of claim 1, wherein:
along a direction perpendicular to the cooling direction, an interval length formed by the adjacent heat-generating components near an edge of the circuit board is smaller than an interval length formed by the adjacent heat-generating components located in a middle section of the circuit board.
3. The circuit board of claim 1, wherein:
along a direction perpendicular to the cooling direction, interval lengths between adjacent heat-generating components in a same column comprise at least two interval lengths of equal length.
4. The circuit board of claim 3, wherein:
along the direction perpendicular to the cooling direction, interval lengths between the adjacent heat-generating components near an upper edge of the circuit board and interval lengths between adjacent heat-generating components near a lower edge of the circuit board are equal.
5. The circuit board of claim 1, wherein:
along the cooling direction, an interval length between a pair of adjacent heat-generating components closest to the air inlet is smaller than an interval length between a pair of adjacent heat-generating components closest to the air outlet, and/or
an average interval length of the adjacent heat-generating components in a front half near the air inlet is smaller than an average interval length of the adjacent heat-generating components in a rear half near the air outlet.
6. The circuit board of claim 1, wherein:
along the cooling direction, an interval length between a pair of adjacent heat-generating components closest to the air inlet is smaller than an average interval length between all adjacent heat-generating components in the circuit board.
7. The circuit board of claim 1, wherein:
part or all of the at least five different interval lengths are negatively correlated with cooling efficiency of an area where the adjacent heat-generating components are located.
8. The circuit board of claim 1, wherein:
along the cooling direction, at least some of interval lengths formed by the adjacent heat-generating components are positively correlated with a distance from the adjacent heat-generating components to the air inlet, and/or
at least some of interval lengths formed by the adjacent heat-generating components are negatively correlated with a distance from the adjacent heat-generating components to the air outlet.
9. The circuit board of claim 1, wherein:
along the cooling direction, part or all of the at least five different interval lengths formed by the adjacent heat-generating components in a same row gradually increase.
10. The circuit board of claim 1, wherein:
in a row direction, centers of at least ten of the plurality of heat-generating components are on a straight line, and/or
in a column direction, centers of at least four of the plurality of heat-generating components are on a straight line.
11. The circuit board of claim 1, wherein:
along the cooling direction, in a same row of the plurality of heat-generating components, a distance between a first heat-generating component and a first side of the circuit board is smaller than a distance between a last heat-generating component and a second side of the circuit board, wherein the first side is a side of a circuit board near the air inlet, and the second side is a side of the circuit board near the air outlet.

12. The circuit board of claim 1, wherein:
at least two consecutive rows of the plurality of heat-generating components constitute a group of heat-generating components, and an interval length between adjacent groups of heat-generating components is not equal to an interval length of heat-generating components in adjacent rows within a same group, and/or
at least two consecutive columns of the plurality of heat-generating components constitute a group of heat-generating components, and an interval length between adjacent groups of heat-generating components is not equal to an interval length of heat-generating components in adjacent columns within a same group.

13. The circuit board of claim 12, wherein:
along the direction perpendicular to the cooling direction, at least two consecutive rows of the heat-generating components form a group of heat-generating components, and an interval length between adjacent groups of heat-generating components is greater than an interval length between heat-generating components in adjacent rows within the same group.

14. The circuit board of claim 13, wherein:
the groups of heat-generating components are distributed symmetrically, and an axis of symmetry of the symmetrically distributed groups of heat-generating components is parallel to the cooling direction.

15. The circuit board of claim 1, wherein:
the plurality of heat-generating components comprises more than 20 or 30 heat-generating components.

16. The circuit board of claim 1, wherein:
the plurality of heat-generating components are chips;
the plurality of heat-generating components have a same size, and/or
a heat-generating area of each of the plurality of heat-generating components is same.

17. A heat dissipation structure, comprising:
a circuit board,
a plurality of heat-generating components arranged in rows and columns on the circuit board, wherein adjacent heat-generating components in a same row or a same column include at least three different interval lengths; and
a first side and a second side of the circuit board, wherein both the first side and the second side are equipped with at least one heat dissipation fin, and heat dissipation efficiency of the at least one heat dissipation fin on the first side is different from heat dissipation efficiency of the at least one heat dissipation fin on the second side.

18. The heat dissipation structure of claim 17, wherein
a first heat sink fin is located on the first side; and
a second heat sink fin is located on the second side.

19. The heat dissipation structure of claim 18, wherein:
a height of the first heat sink fin is different from a height of the second heat sink fin, wherein the heights are measured from a dimension perpendicular to a plane of the circuit board.

20. The heat dissipation structure of claim 18, wherein:
a plurality of the second heat sink fins constitute a group of heat sink fins, and
the second heat dissipation fin comprises a plurality of groups of heat sink fins, and each of the plurality of groups of heat sink fins corresponds to one or more of the plurality of heat-generating components.

21. The heat dissipation structure of claim 20, wherein:
spacing between two adjacent groups of heat sink fins is greater than spacing between adjacent second heat sink fins within a same group of heat sink fins, and/or
within the same group of heat sink fins, a height of at least some of the plurality of second heat sink fins differs from a height of other second heat sink fins, where the heights are measured in a dimension perpendicular to a plane of the circuit board.

22. The heat dissipation structure of claim 18, wherein:
the first heat dissipation fin further includes a first heat dissipation main body, two sides of the first heat dissipation main body are respectively connected to the first heat sink fin and the first side of the circuit board; and/or
the second heat dissipation fin further includes a second heat dissipation main body, two sides of the second heat dissipation main body are respectively connected to the second heat sink fin and the second side of the circuit board.

23. The heat dissipation structure of claim 18, wherein:
except for the first heat dissipation fin, the heat dissipation structure does not have any other structures for carrying the circuit board.

24. A computing device, comprising:
a heat dissipation structure, and
a device casing forming a cooling air duct and comprising a first panel component and a second panel component, the heat dissipation structure being installed within the cooling air duct,
wherein:
the heat dissipation structure comprises a circuit board with a first side and a second side, and a plurality of heat-generating components arranged in rows and columns on the circuit board, wherein adjacent heat-generating components in a same row or a same column include at least three different interval lengths, and a first heat dissipation fin and a second heat dissipation fin are respectively set on the first side and the second side of the circuit board, and
the first panel component and the second panel component are used to parallelly fix the first heat dissipation fin and the second heat dissipation fin of the heat dissipation structure within the cooling air duct.

25. The computing device of claim 24, wherein:
a plurality of temperature detectors are installed within the cooling air duct, and the plurality of temperature detectors are located in different areas within the cooling air duct.

26. The computing device of claim 25, wherein:
the cooling air duct is divided into a plurality of temperature zones, and each the plurality of temperature zones corresponds to at least one of the plurality of temperature detectors.

27. A mine, comprising at least one frame provided with at least one computing device, wherein the at least one computing device comprises:
a heat dissipation structure, and
a device casing forming a closed cooling air duct and comprising a first panel component and a second panel component, the heat dissipation structure being installed within this cooling air duct,
wherein:
the heat dissipation structure comprises a circuit board with a first side and a second side, and a plurality of heat-generating components arranged in rows and columns on the circuit board, wherein adjacent heat-generating components in a same row or a same column include at least three different interval lengths, and a first heat dissipation fin and a second heat dissipation fin are respectively set on the first side and the second side of the circuit board, and the first panel component and the second panel component are used to parallelly fix the first heat dissipation fin and the second heat dissipation fin of the heat dissipation structure within the cooling air duct.

\* \* \* \* \*